United States Patent
Chen et al.

(10) Patent No.: US 9,629,460 B1
(45) Date of Patent: Apr. 25, 2017

(54) SLIDE RAIL ASSEMBLY WITH BRACKET

(71) Applicants: KING SLIDE WORKS CO., LTD., Kaohsiung (TW); KING SLIDE TECHNOLOGY CO.,LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/001,266

(22) Filed: Jan. 20, 2016

(30) Foreign Application Priority Data

Oct. 6, 2015 (TW) .............................. 104132952 A

(51) Int. Cl.
| | |
|---|---|
| *A47B 96/06* | (2006.01) |
| *A47B 88/04* | (2006.01) |
| *H05K 7/18* | (2006.01) |
| *H05K 7/14* | (2006.01) |
| *A47B 96/02* | (2006.01) |

(52) U.S. Cl.
CPC .......... *A47B 88/044* (2013.01); *A47B 96/025* (2013.01); *A47B 96/06* (2013.01); *H05K 7/1489* (2013.01); *H05K 7/183* (2013.01)

(58) Field of Classification Search
CPC ..... A47B 96/025; A47B 88/044; A47B 96/07; A47B 96/06; A47B 96/16; H05K 7/183; H05K 7/1489
USPC ...................................................... 248/219.3
See application file for complete search history.

(56) References Cited

U.S. PATENT DOCUMENTS

| | | | |
|---|---|---|---|
| 7,192,103 | B2 | 3/2007 | Hamilton |
| 7,731,142 | B2 | 6/2010 | Chen |
| 8,079,654 | B2 | 12/2011 | Yu |
| 8,146,756 | B2 | 4/2012 | Brock |
| 9,258,923 | B2 | 2/2016 | Chen |
| 9,370,120 | B2 * | 6/2016 | Chen ................... A47B 96/025 |
| 2015/0201754 | A1 * | 7/2015 | Chen ................... A47B 96/025 248/219.3 |
| 2016/0097229 | A1 | 4/2016 | Chen |

FOREIGN PATENT DOCUMENTS

| | | |
|---|---|---|
| CN | 102695396 B | 12/2014 |
| JP | 2010359 A | 1/2010 |
| JP | 3189813 U | 4/2014 |
| JP | 3195177 U | 1/2015 |

* cited by examiner

*Primary Examiner* — Todd M Epps
(74) *Attorney, Agent, or Firm* — Winston Hsu; Scott Margo

(57) ABSTRACT

A slide rail assembly includes a rail element, a bracket and a hook. The bracket is connected to the rail element and configured to be mounted to a post. The hook is connected to the bracket. When the bracket is mounted to the post, the rail element can be operatively moved to be adjacent to the hook in order to block the hook from moving relative to the bracket, such that the hook can be held at a position relative to the post.

10 Claims, 9 Drawing Sheets

SLIDE RAIL ASSEMBLY WITH BRACKET

BACKGROUND OF THE INVENTION

1. Field of the Invention

The present invention relates to a slide rail assembly, and more particularly, to a slide rail assembly with a bracket capable of moving a rail element to a position for blocking a hook from moving relative to the bracket.

2. Description of the Prior Art

China patent publication number CN102695396B discloses a slide rail tool free mounting frame for a server, which comprises a pair of frame positioning columns (4) arranged on a slide rail back mounting frame (1) and a frame floating hook (2). The frame floating hook (2) includes a pair of hooks (230) respectively arranged on a pair of wings (205), which are respectively provided with slide guide sleeves (201) and are in fixed connection through an ' arch door' shaped bending piece (206). The slide rail back mounting frame (1) is fixed with two slide guide columns (101), which are sleeved in the slide guide sleeves (201) and are in fixed connection through limit screws (7). First return springs (6) are arranged on the slide guide sleeves (201) between the wings (205) and the limit screws (7). The slide rail back mounting frame (1) is further provided with a floating pin hole (104) for placing a floating pin (3). One end of the floating pin (3) is connected to the 'arch door' shaped bending piece (206) through the limit screws (7), and the other end of the floating pin is a conical head (301) arranged in the floating pin hole (104). Second return springs (5) are arranged on the floating pin (3) between an end face of the conical head (301) and the limit screws (7).

According to such arrangement, although the prior art can lock or release the slide rail back mounting frame (1) through the floating pin (3) driven by an outer rail of the slide rail covered by a back frame. However, the structure disclosed by the prior art is complex, such that overall functions may be affected.

SUMMARY OF THE INVENTION

The present invention relates to a slide rail assembly capable of moving a rail element to a position for blocking a hook from moving relative to a bracket.

According to an embodiment of the present invention, a slide rail assembly is configured to be mounted to a first post and a second post. The slide rail assembly comprises a rail element, a first bracket, a second bracket and a hook. The rail element has a first end part and a second end part. The first bracket is connected to the rail element and adjacent to the first end part. The rail element is configured to be mounted to the first post through the first bracket. The second bracket is connected to the rail element and adjacent to the second end part. The rail element is configured to be mounted to the second post through the second bracket. The hook is connected to the first bracket. Wherein, when the first bracket is mounted to the first post, the hook is located at a close position relative to the first post. Wherein, when the rail element is operatively moved to be adjacent to the hook, the rail element is configured to block the hook from moving away from the close position.

According to the above embodiment, the slide rail assembly further comprises an elastic element configured to apply an elastic force to the hook, and arranged between the first bracket and the hook.

According to the above embodiment, the slide rail assembly further comprises a supporting frame connected to the rail element, and comprising a passage; and an extension element connected to the first bracket, wherein a portion of the extension element is arranged inside the passage.

According to the above embodiment, one of the first bracket and the hook has a guiding part. The hook is connected to the first bracket through the guiding part by a connection element.

Preferably, the guiding part is an elongated hole.

According to the above embodiment, the first bracket has a first contact part, and the hook has a second contact part. When the first bracket is operatively moved along a direction with the hook abutting against the first post for dismounting the first bracket from the first post, the first contact part of the first bracket pushes the second contact part, such that the hook is moved away from the close position for being detached from the first post.

Preferably, one of the first contact part and the second contact part has an inclined surface.

Preferably, the supporting frame comprises a first part, and the extension element comprises a second part. The first bracket is configured to be operatively moved when the first part abuts against the second part.

According to the above embodiment, the hook is pivoted to the first bracket by a connection element.

According to another embodiment of the present invention, a bracket device for a rail element comprises a bracket and a hook. The bracket is movable relative to the rail element. The hook is connected to the bracket and movable between a close position and an open position relative to the bracket. Wherein, when the hook is located at the close position relative to the bracket, and the rail element is operatively moved to be adjacent to the hook, the rail element is configured to block the hook from moving away from the closed position relative to the bracket. Wherein, when the rail element is operatively moved without blocking the hook, the hook is capable of moving from the close position to the open position.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
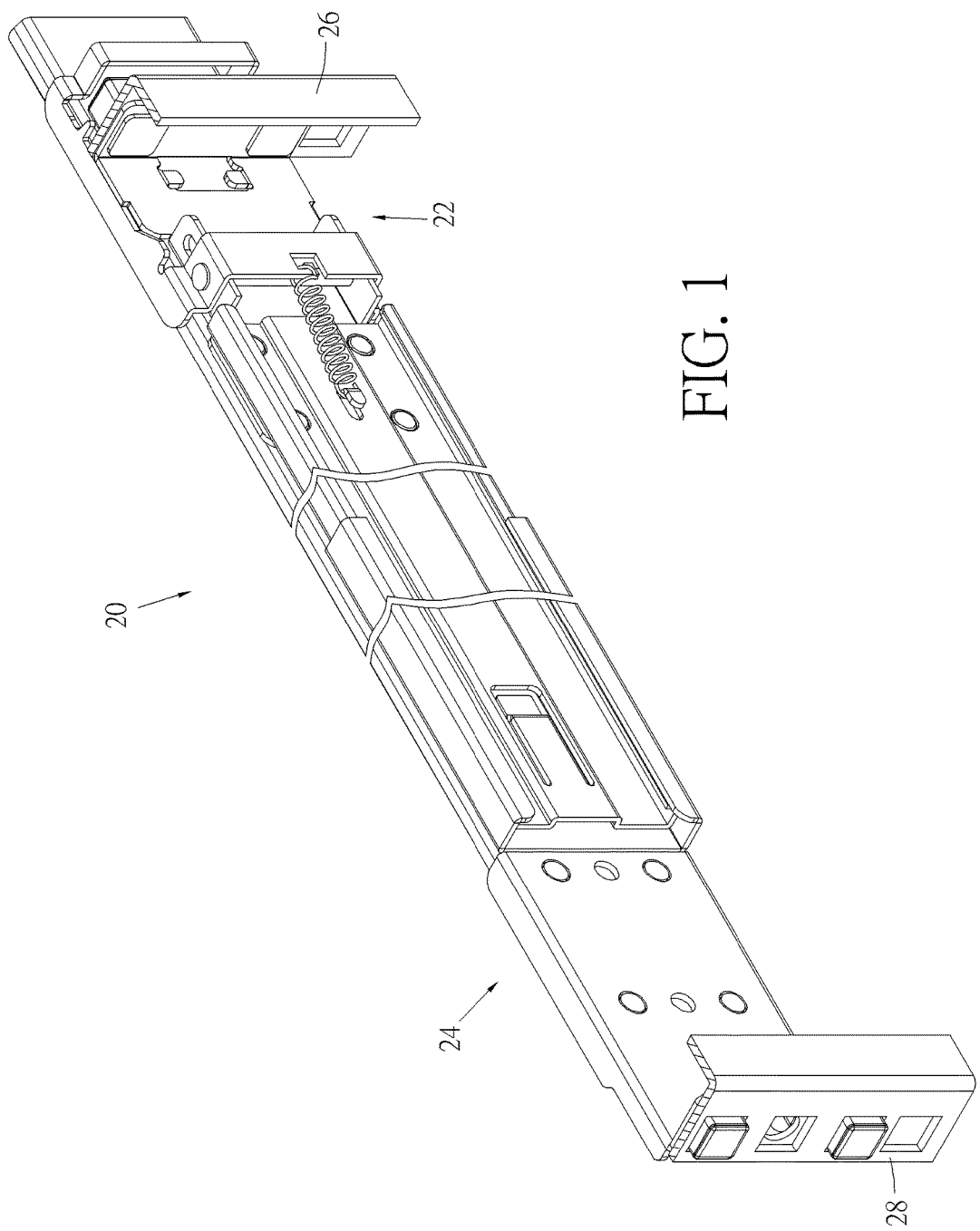
FIG. 1 is a diagram showing a slide rail assembly being mounted to a first post and a second post according to an embodiment of the present invention.

As shown in FIG. 1, a slide rail assembly 20 is mounted to a first post 26 and a second post 28 through a first bracket 22 and a second bracket 24 according to an embodiment of the present invention.

Figure 2:
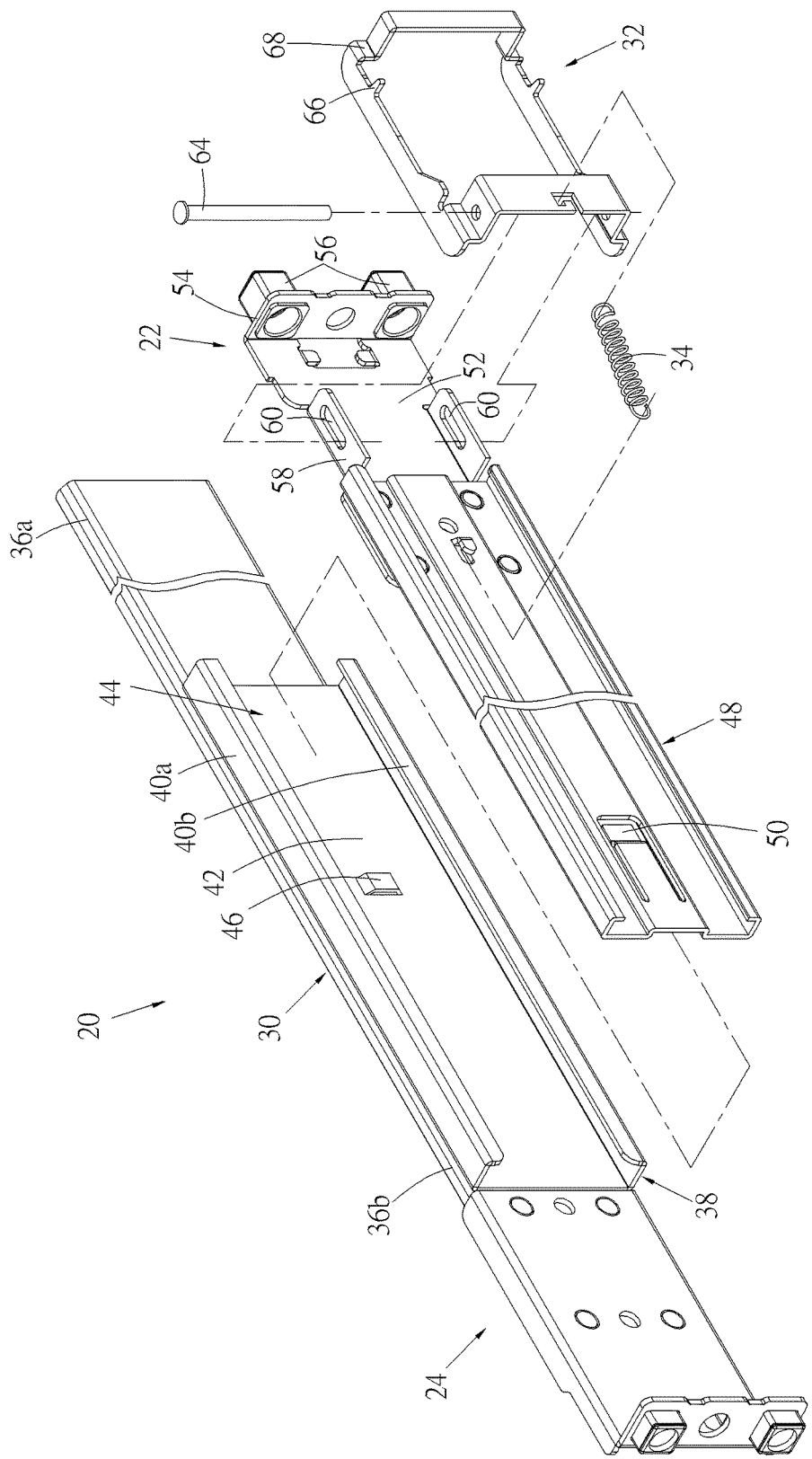
FIG. 2 is an exploded view of the slide rail assembly according to an embodiment of the present invention.

As shown in FIG. 2, the slide rail assembly 20 comprises a rail element 30 and a hook 32. The rail element 30 has a first end part 36a and a second end part 36b. The second bracket 24 is connected to the rail element 30 and adjacent to the second end part 36b. Preferably, the slide rail assembly 20 further comprises a supporting frame 38 fixedly connected to the rail element 30, and the supporting frame 38 can be seen as a part of the rail element 30. Specifically, the supporting frame 38 has an upper wall 40a, a lower wall 40b, and a longitudinal wall 42 connected between the upper wall 40a and the lower wall 40b. A passage 44 is defined by the upper wall 40a, the lower wall 40b and the longitudinal wall 42. The longitudinal wall 42 has a first part 46, such as a bump. Preferably, the slide rail assembly 20 further comprises an extension element 48 fixedly connected to the first bracket 22, and the extension element 48 can be seen as a part of the first bracket 22. The first bracket 22 is movable relative to the supporting frame 38 through the extension element 48, such that the first bracket 22 can be moved to a position adjacent to the first end part 36a of the rail element 30. More particularly, a portion of the extension element 48 is arranged inside the passage 44 of the supporting frame 38, and the extension element 48 has a second part 50, such as an elastic arm.

Figure 3:
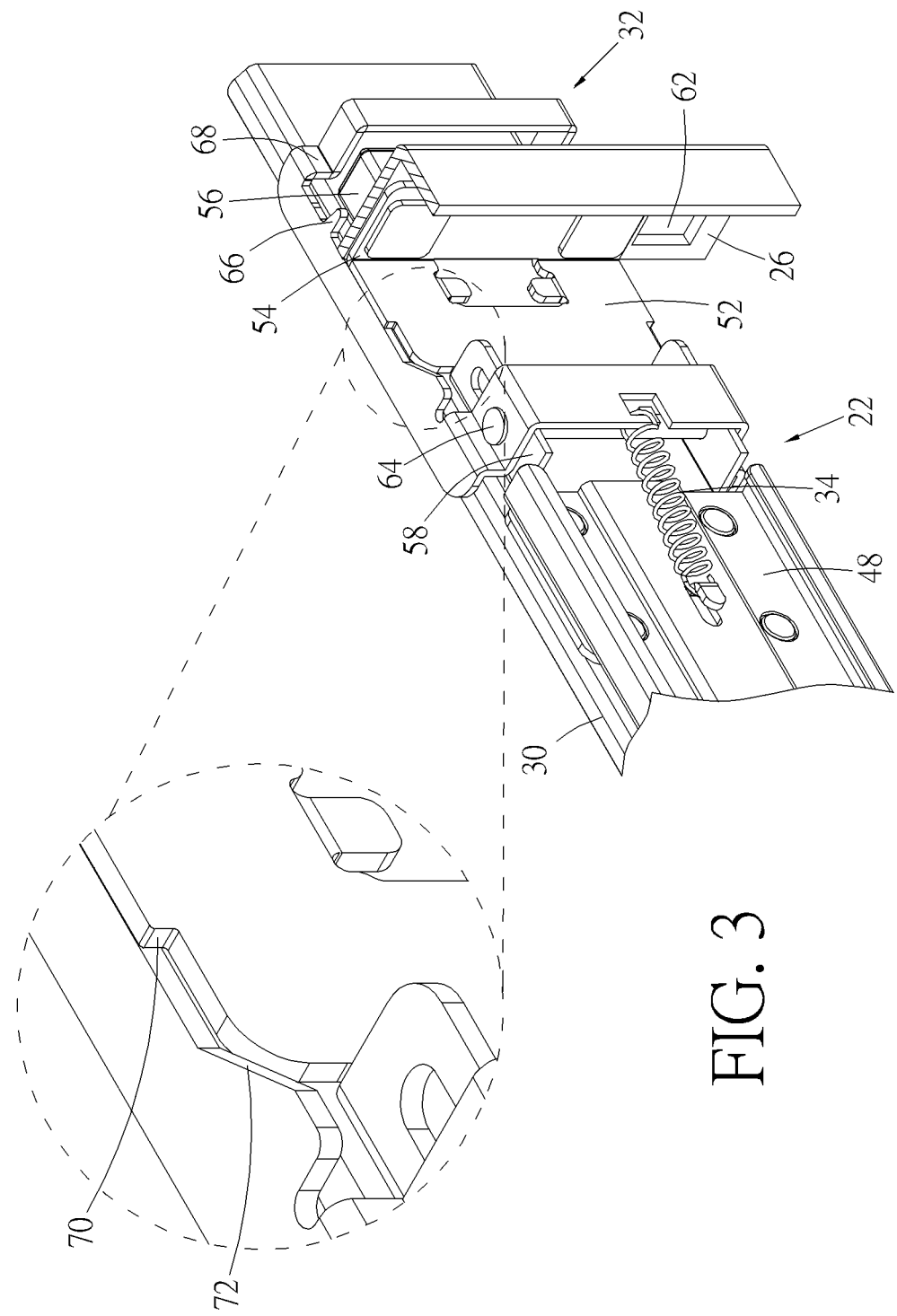
FIG. 3 is a diagram showing a first bracket being mounted to the first post according to an embodiment of the present invention.

As shown in FIG. 2 and FIG. 3, the first bracket 22 comprises a side plate 52, an end plate 54 and at least one mounting element 56. In the present embodiment, the side plate 52 is connected to the extension element 48. At least one ear part 58 is arranged on the side plate 52 and is bent from the side plate 52. One of the first bracket 22 and the hook 32 has a guiding part 60. In the present embodiment, the first bracket 22 has the guiding part 60 for example. The guiding part 60 is an elongated hole. The end plate 54 is bent from the side plate 52 or vertically connected to the side plate 52. The at least one mounting element 56 is mounted to the end plate 54, and the at least one mounting element 56 is configured to be mounted to a hole 62 of the first post 26. The hook 32 is connected to the first bracket 22. Preferably, the hook 32 is connected to the first bracket 22 through the guiding part 60 by a connection element 64, in order to pivot the hook 32 to the first bracket 22.

The hook 32 has at least one blocking part 66 and a blocking wall 68. Preferably, the slide rail assembly 20 further comprises an elastic element 34 configured to apply an elastic force to the hook 32. The elastic element 34 can be arranged between the first bracket 22 and the hook 32. Preferably, the first bracket 22 has a first contact part 70 and the hook 32 has a second contact part 72. One of the first contact part 70 and the second contact part 72 has an inclined surface.

Figure 4:
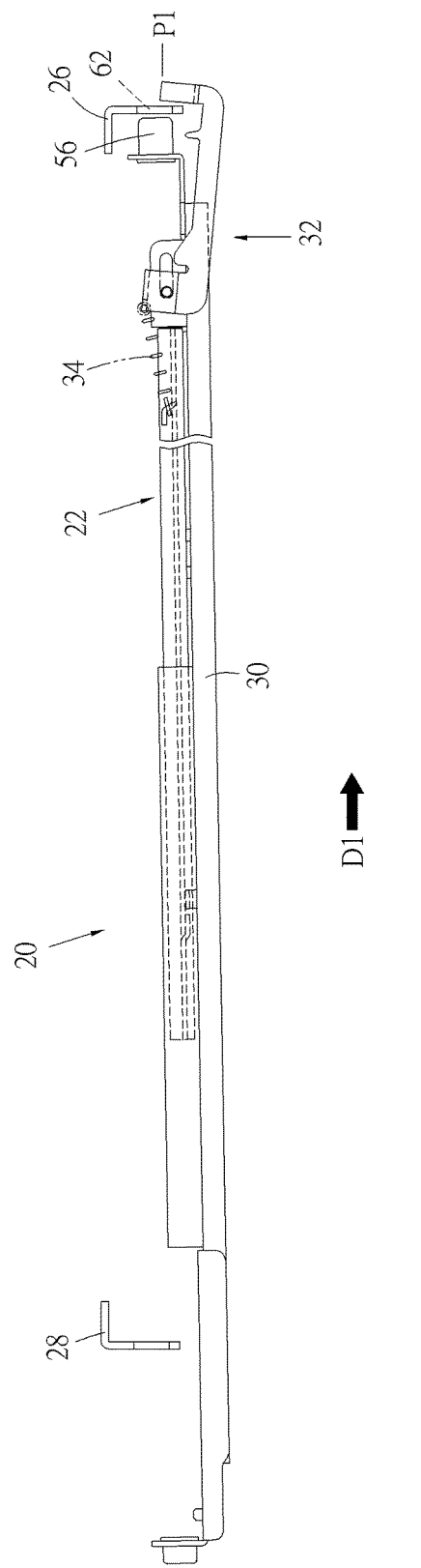
FIG. 4 is a diagram showing operation of mounting the slide rail assembly to the first post according to an embodiment of the present invention.

As shown in FIG. 4, when the slide rail assembly 20 is going to be mounted to the first post 26 and the second post 28, a user can apply a force to move the first bracket 22 of the slide rail assembly 20 toward the first post 26 at an angle along a first direction D1. Meanwhile, the hook 32 can be operatively deflected at an angle to be located at an open position P1 relative to the first bracket 22, and the elastic element 34 can generate an elastic force in response to a movement of the hook 32 relative to the first bracket 22.

Figure 5:
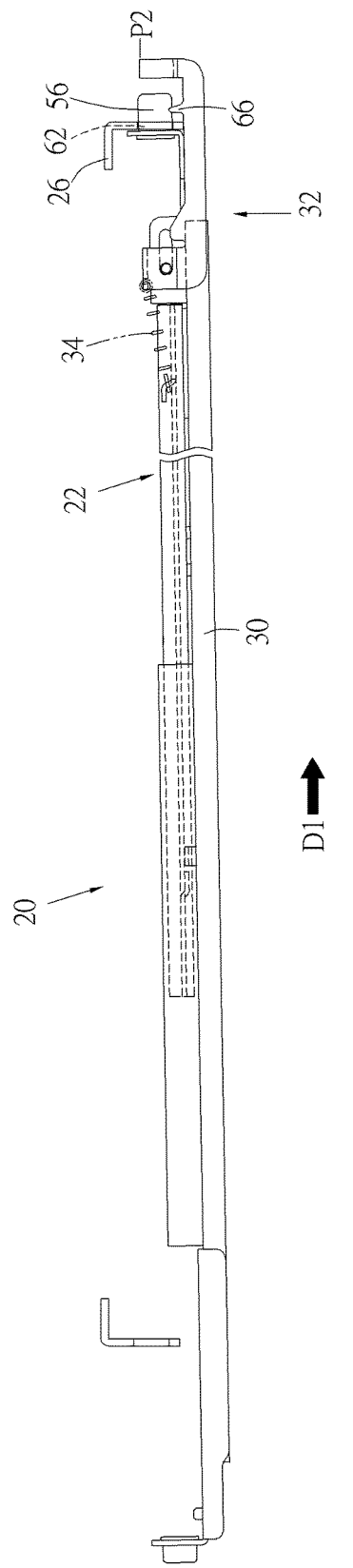
FIG. 5 is a diagram showing the slide rail assembly being mounted to the first post according to an embodiment of the present invention.

As shown in FIG. 4 and FIG. 5, when the first bracket 22 of the slide rail assembly 20 is further moved along the first direction D1, until the mounting element 56 of the first bracket 22 is mounted to the hole 62 of the first post 26, the elastic element 34 can releases the elastic force in an unoperated status, such that the hook 32 is moved from the open position P1 to a close position P2 in response to the elastic force, in order to hold the hook 32 at the close position P2 relative to the first post 26. In other words, the hook 32 can be held at the close position P2 by the elastic force of the elastic element 34. When the hook 32 is located at the close position P2, the at least one blocking part 66 of the hook 32 corresponds to or faces toward the first post 26.

Figure 6:
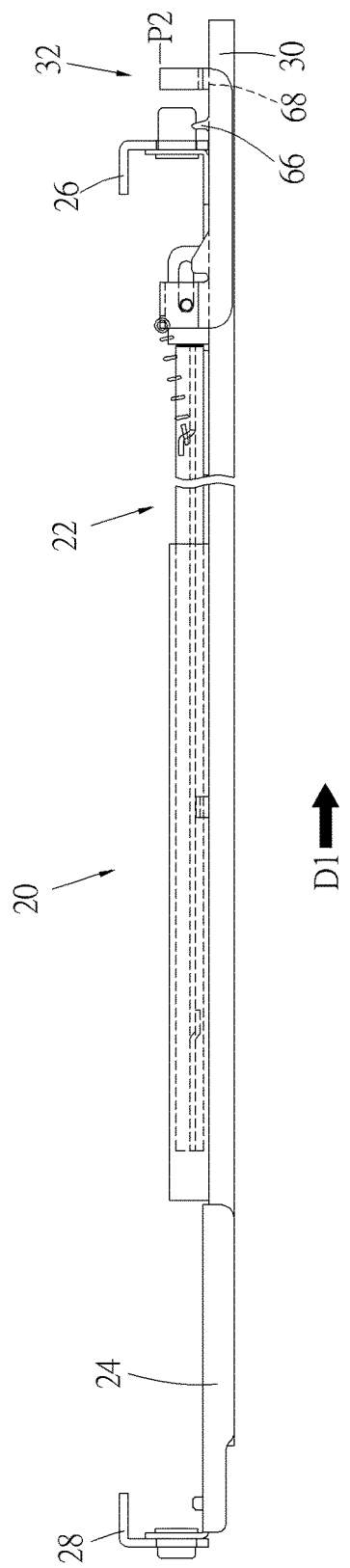
FIG. 6 is a diagram showing the slide rail assembly being mounted to the first post and the second post according to an embodiment of the present invention.

As shown in FIG. 5 and FIG. 6, when the first bracket 22 is mounted to the first post 26 and the hook 32 is located at the close position P2, the rail element 30 can be operatively moved to be adjacent to the hook 32, in order to block the hook 32 from moving away from the close position P2 relative to the first bracket 22. Specifically, the user can apply a force along the first direction D1 to the rail element 30, in order to move the rail element 30 relative to the first bracket 22 along the first direction D1. When a portion of the rail element 30 is moved to a position adjacent to the blocking wall 68 of the hook 32, the portion of the rail element 30 can be utilized to block the hook 32 from moving away from the close position P2 relative to the first bracket 22. That is to say, in such state, the hook 32 cannot be deflected to move from the close position P2 to the open position P1 since the blocking wall 68 is blocked by the rail element 30. Therefore, the hook 32 can be held at the close position P2 relative to the first post 26 for ensuring that the blocking part 66 of the hook 32 is kept in a state of corresponding to or facing toward the first post 26, so as to achieve a purpose of locking the first bracket 22 on the first post 26.

As shown in FIG. 6, after mounting the first bracket 22 to the first post 26, the user can apply a force to the second bracket 24 of the slide rail assembly 20 until the second bracket 24 is mounted to the second post 28, so as to complete operation of mounting the slide rail assembly 20 to the first post 26 and the second post 28. More particularly, operation of mounting the second bracket 24 to the second post 28 and dismounting the second bracket 24 from the second post 28 is well known to those skilled in the art, therefore, no further illustration is provided.

Figure 7:
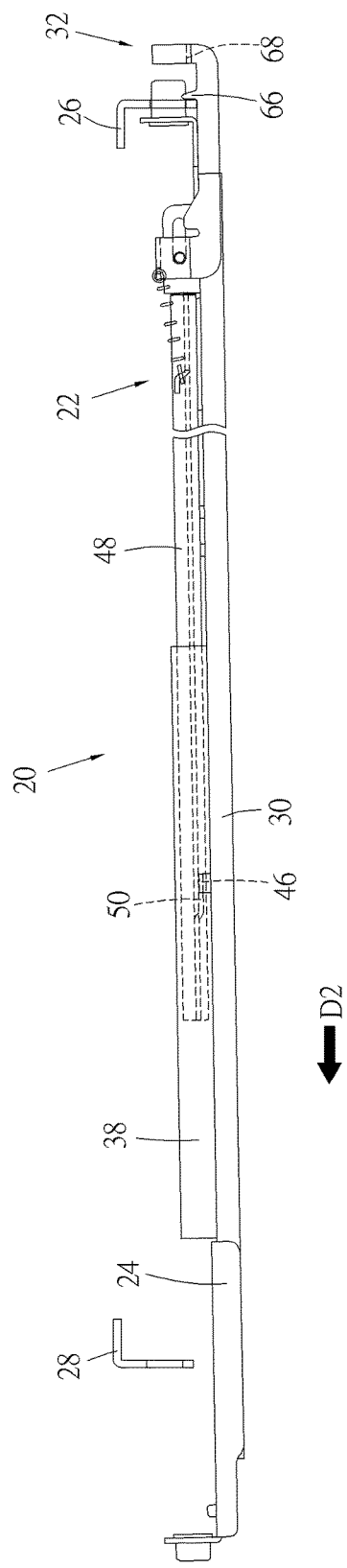
FIG. 7 is a diagram showing the slide rail assembly being detached from the first post according to an embodiment of the present invention, wherein a rail element can be utilized to drive the first bracket to move.

As shown in FIG. 7, when the slide rail assembly 20 is going to be dismounted from the first post 26 and the second post 28, the user can release a locking mechanism between the second bracket 24 and the second post 28 (the locking mechanism is not shown in figures) in order to detach the second bracket 24 from the second post 28. Thereafter, the user can apply a force to the rail element 30 along a second direction D2, in order to move the rail element 30 along the second direction D2 until the rail element 30 no longer blocks the blocking wall 68 of the hook 32. While moving along the second direction D2, the first part 46 of the supporting frame 38 of the rail element 30 can abut against the second part 50 of the extension element 48 of the first bracket 22, such that the first bracket 22 can be operatively moved along the second direction D2 by the rail element 30 until the blocking part 66 of the hook 32 abuts against the first post 26.

Figure 8:
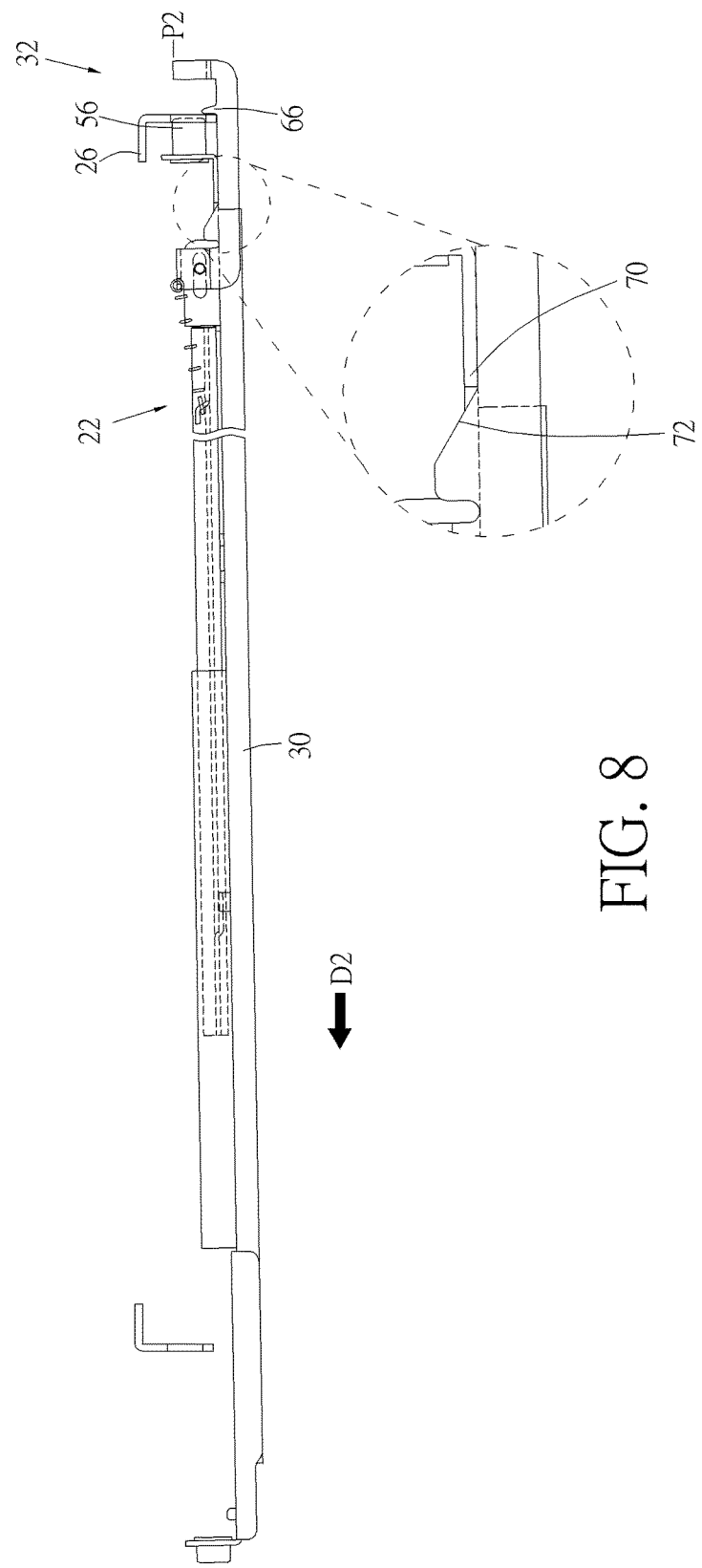
FIG. 8 is a diagram showing the rail element of the slide rail assembly driving the first bracket to move relative to the first post according to an embodiment of the present invention.

As shown in FIG. 8, when the rail element 30 is further moved along the second direction D2 to drive the first bracket 22 to move along the second direction D2, the guiding part 60 further provides moving space for allowing the first bracket 22 to move relative to the hook 32 along the second direction D2 since the blocking part 66 of the hook 32 abuts against the first post 26.

Figure 9:
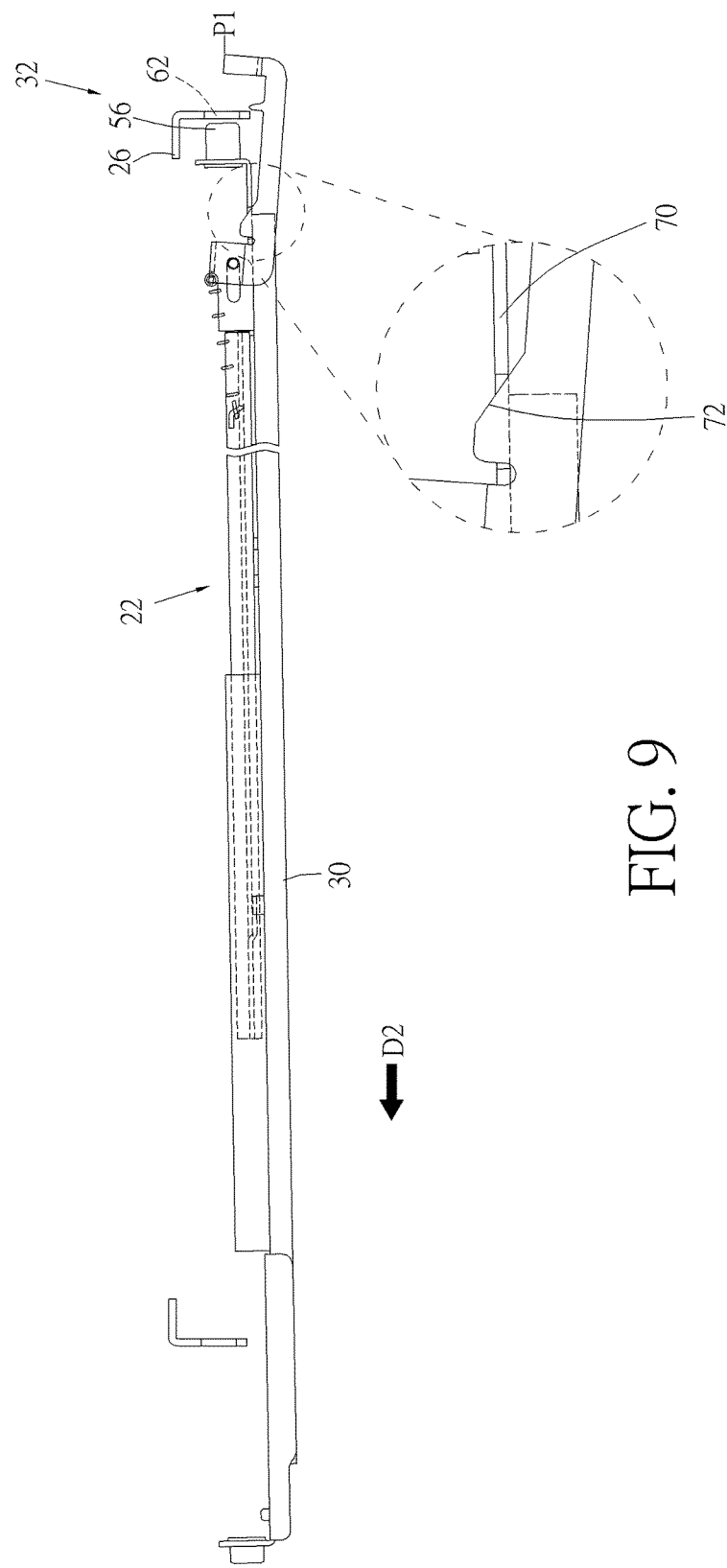
FIG. 9 is a diagram showing the slide rail assembly being dismounted from the first post and the second post according to an embodiment of the present invention.

As shown in FIG. 8 and FIG. 9, when the rail element 30 is moved still further along the second direction D2 to drive the first bracket 22 to move along the second direction D2, the mounting element 56 of the first bracket 22 is detached from the hole 62 of the first post 26 to move to a predetermined position, and the first contact part 70 of the first bracket 22 can push the second contact part 72 of the hook 32 to deflect the hook 32 to move from the close position P2 to the open position P1 relative to the first post 26, in order to detach the hook 32 from the first post 26.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, configured to be mounted to a first post and a second post, the slide rail assembly comprising:
   a rail element having a first end part and a second end part;
   a first bracket connected to the rail element and adjacent to the first end part, the rail element configured to be mounted to the first post through the first bracket;
   a second bracket connected to the rail element and adjacent to the second end part, the rail element configured to be mounted to the second post through the second bracket; and
   a hook connected to the first bracket;
   wherein when the first bracket is mounted to the first post, the hook is located at a close position relative to the first post;
   wherein when the rail element is operatively moved to be adjacent to the hook, the rail element is configured to block the hook from moving away from the close position.

2. The slide rail assembly of claim 1, further comprising an elastic element configured to apply an elastic force to the hook, and arranged between the first bracket and the hook.

3. The slide rail assembly of claim 1, further comprising:
   a supporting frame connected to the rail element, the supporting frame comprising a passage; and
   an extension element connected to the first bracket, a portion of the extension element being arranged inside the passage.

4. The slide rail assembly of claim 1, wherein one of the first bracket and the hook has a guiding part, the hook is connected to the first bracket through the guiding part by a connection element.

5. The slide rail assembly of claim 4, wherein the guiding part is an elongated hole.

6. The slide rail assembly of claim 1, wherein the first bracket has a first contact part, the hook has a second contact part, when the first bracket is operatively moved along a direction with the hook abutting against the first post for dismounting the first bracket from the first post, the first contact part of the first bracket pushes the second contact part, such that the hook is moved away from the close position for being detached from the first post.

7. The slide rail assembly of claim 6, wherein one of the first contact part and the second contact part has an inclined surface.

8. The slide rail assembly of claim 3, wherein the supporting frame comprises a first part, the extension element comprises a second part, the first bracket is configured to be operatively moved when the first part abuts against the second part.

9. The slide rail assembly of claim 1, wherein the hook is pivoted to the first bracket by a connection element.

10. A bracket device for a rail element, comprising:
    a bracket movable relative to the rail element; and
    a hook connected to the bracket and movable between a close position and an open position relative to the bracket;
    wherein when the hook is located at the close position relative to the bracket, and the rail element is operatively moved to be adjacent to the hook, the rail element is configured to block the hook from moving away from the closed position relative to the bracket;
    wherein when the rail element is operatively moved without blocking the hook, the hook is capable of moving from the close position to the open position.

* * * * *